United States Patent
Sprouse

(10) Patent No.: US 6,794,997 B2
(45) Date of Patent: Sep. 21, 2004

(54) EXTENDING NON-VOLATILE MEMORY ENDURANCE USING DATA ENCODING

(75) Inventor: Steven T. Sprouse, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/370,413

(22) Filed: Feb. 18, 2003

(65) Prior Publication Data

US 2004/0160343 A1 Aug. 19, 2004

(51) Int. Cl.[7] .......................... H03M 7/00; G11C 16/04
(52) U.S. Cl. ..................... 341/50; 714/718; 365/185.29
(58) Field of Search .............................. 341/50, 65, 67; 714/718, 723, 171 S; 711/100; 365/185.29, 185.24, 185.02, 185.22

Primary Examiner—Peguy JeanPierre
(74) Attorney, Agent, or Firm—Meyertons Hood Kivlin Kowert & Goetzel, P.C.; B. Noël Kivlin

(57) ABSTRACT

An embedded system comprising a CPU and non-volatile memory is adapted to extend the endurance of the non-volatile memory through the use of an encoding of information stored in the non-volatile memory. One or more data bits are encoded into a larger number of non-volatile memory bit patterns such that changes to the data bits are distributed across fewer changes per non-volatile memory bit. Non-volatile memory endurance is extended since more changes to the data values are possible than can be supported by underlying changes to individual non-volatile memory bits. Word pre-erase, if present, can be accommodated as well as memory bit failures.

27 Claims, 6 Drawing Sheets

EXTENDING NON-VOLATILE MEMORY ENDURANCE USING DATA ENCODING

FIELD OF THE INVENTION

The invention relates to the field of computer systems, and more particularly to microcontroller based embedded systems incorporating non-volatile memories.

BACKGROUND OF THE INVENTION

Embedded systems are systems designed to perform a dedicated function and are often part of a larger system or product. An embedded system may incorporate microprocessors or microcontrollers along with memory and special purpose peripherals, including timers, counters, A/D converters and I/O interface circuitry. The memory included in an embedded system will typically include program memory and data memory. Data memory is usually based on static or dynamic RAM and is volatile, i.e. it will not retain its contents after power is removed. Often the program memory is stored in a non-volatile technology, such as a mask programmed ROM or flash EEPROM, and doesn't change over the lifetime of the product. There is frequently a need for another type of memory, a non-volatile memory that can be dynamically written, to be used, for example, to store configuration or logging information. This memory is usually a relatively small amount of memory, and since it is non-volatile it will retain its contents after power is removed from the system, so that the next time power is applied, the previous contents can be read. In some cases dynamically writable non-volatile memories are incorporated on-chip in single chip microcontrollers. For example, the PIC12F629 manufactured by Microchip Technology incorporates 128 bytes of EEPROM data memory that can be re-programmed during normal operation.

Non-volatile memory cells are commonly constructed using a floating gate technology, although other technologies are possible. In a floating gate memory cell, charge is deposited or removed from a floating gate to either program or erase the cell. Since the gate is surrounded by oxide, it will retain its charge almost indefinitely. However, the process of erasing and programming a floating gate memory cell introduces stress to the surrounding oxide and thus wears down the cell. For this reason, devices incorporating floating gate memory cells are generally rated with an endurance limit, usually expressed in terms of the number of erase/program cycles that a memory cell, or group of memory cells, can go through. A typical number of cycles specified by a manufacturer is in the range of 10,000 cycles to 1,000,000 cycles, depending on the particular device, and sometimes the environmental conditions, such as ambient temperature. For example the EEPROM array of the PIC12F629 is rated at 10,000 cycles minimum and 100,000 cycles typical at an ambient temperature range of +85° C. to +125° C. and 100,000 cycles minimum and 1,000,000 cycles typical at an ambient temperature range of −40° C. to +85° C.

In some circumstances it is desirable to cycle non-volatile memories more times over the lifetime of a product than the limit imposed by floating gate memory cell technology. One way to get around these limitations is to use battery backed-up static RAM (SRAM) instead of floating gate based EEPROM. This technique includes a battery in addition to conventional volatile memory. When system power is removed, the battery takes over and supplies power to the SRAM memory cells, allowing them to retain their contents until system power is once again supplied. An example of a self-contained non-volatile memory device based on this design is the M48Z02 manufactured by ST Microelectronics. This device incorporates 2048 bytes of volatile memory, voltage sense and switching circuitry and a lithium battery into a single package. While these types of devices have no erase/write cycle limitations, they are expensive, have a large footprint and cannot be incorporated on-chip into other devices.

Another method of addressing endurance limitations of non-volatile memory is to include both volatile memory and non-volatile memory as a single unit. When power is applied, the contents of the non-volatile memory are read into the contents of the volatile memory. During normal operation, reads and writes take place to the volatile memory. Before power is removed, the contents of the volatile memory are written back to the non-volatile memory. The writing of the non-volatile memory can occur at specific times, at pre-programmed intervals or under the control of shutdown circuitry. This type of system utilizes the volatile memory to buffer write operations, such that a smaller number of writes takes place to the non-volatile memory. An example of a product based on this design is the CAT22C10 manufactured by Catalyst Semiconductor, Inc. This device incorporates a 256-bit EEPROM array, a 256-bit static RAM (SRAM) array, a control signal (/RECALL) that cause the contents of the EEPROM to be transferred into the SRAM, and a control signal (/STORE) that causes the contents of the SRAM to be written into the EEPROM. The CAT22C10 is rated at up to 100,000 store operations due to the endurance limitations of the EEPROM array, but can perform unlimited recall operations and can perform unlimited writes to the SRAM. While this type of design can reduce the number of erase/program cycles, it is expensive since twice the number of memory cells are required. Furthermore, this type of design suffers from the problem that the EEPROM array and the SRAM array are not always consistent. Unless it can be Guaranteed that the store operation will always take place before power is removed, there is a chance that a data write will be lost. The alternative of forcing every write to the SRAM generate a store operation eliminates the endurance advantage of having the SRAM.

It is therefore desirable to allow data to be written to non-volatile memory more times than is allowed by the erase/program cycle limit specified by the manufacturer. An inexpensive and small design is preferred that does not utilize batteries or duplicate arrays of volatile memories. Additionally, it is desirable to allow off the shelf microcontrollers to be used without hardware modifications. Finally it is preferred to allow data to continue to be stored and retrieved from non-volatile memory in the presence of failures of the underling memory cells.

SUMMARY OF THE INVENTION

The present invention is a method and apparatus for increasing the endurance of a non-volatile memory. A read operation is performed by converting a stored bit pattern into a data value where the data value has a smaller number of bits than the stored bit pattern. A write operation is similarly performed by converting a data value into a stored bit pattern where the data value has a smaller number of bits than the stored bit pattern. Additionally, the writing of information utilizes the previously stored bit pattern such that only a subset of the bits in the newly stored bit pattern are changed from their previously stored values. This subset may be empty if no bits need to be changed from their previous states.

In one embodiment of the invention, the read conversion includes reading two bit patterns from memory and comparing them for equality. In this embodiment, the write conversion includes leaving the memory unchanged, changing one bit pattern to be equal to a second bit pattern, or by changing the second bit pattern to be equal to the first bit pattern.

In another embodiment of the invention, the read conversion includes using a gray code to binary conversion. In this embodiment, the write operation includes either leaving the memory unchanged or utilizing a gray code to binary conversion, followed by a two's complement add, followed by a binary to gray code conversion.

Information can be stored such that a bit pattern is striped across multiple words such that one bit is stored in each word. It is also possible to accommodate one or more bit failures by repeating the write operation using a different store bit pattern such that the new bit pattern will be decoded into the same data value.

SUMMARY OF THE FIGURES

The present invention will be described with reference to the drawings, in which.

The invention will be better understood with reference to the drawings and detailed description below.

DETAILED DESCRIPTION

The present invention is directed to a method and system that is designed to provide extended endurance of non-volatile memories. Embodiments of the present invention provide for extending endurance limitations by encoding information to be stored in non-volatile memory such that changes to that information can be accomplished with a minimal number of erase/program cycles placed on non-volatile memory cells. Firmware incorporating this encoding and decoding of information can be provided such than an embedded system can store information and re-write the stored information a number of times that far exceeds the manufacturer limits on non-volatile cell endurance. This firmware can be used in conjunction with off the shelf microcontrollers. Furthermore, embodiments of the present invention can be used to read and write data to non-volatile memories even in the presence of memory failures.

Figure 1:
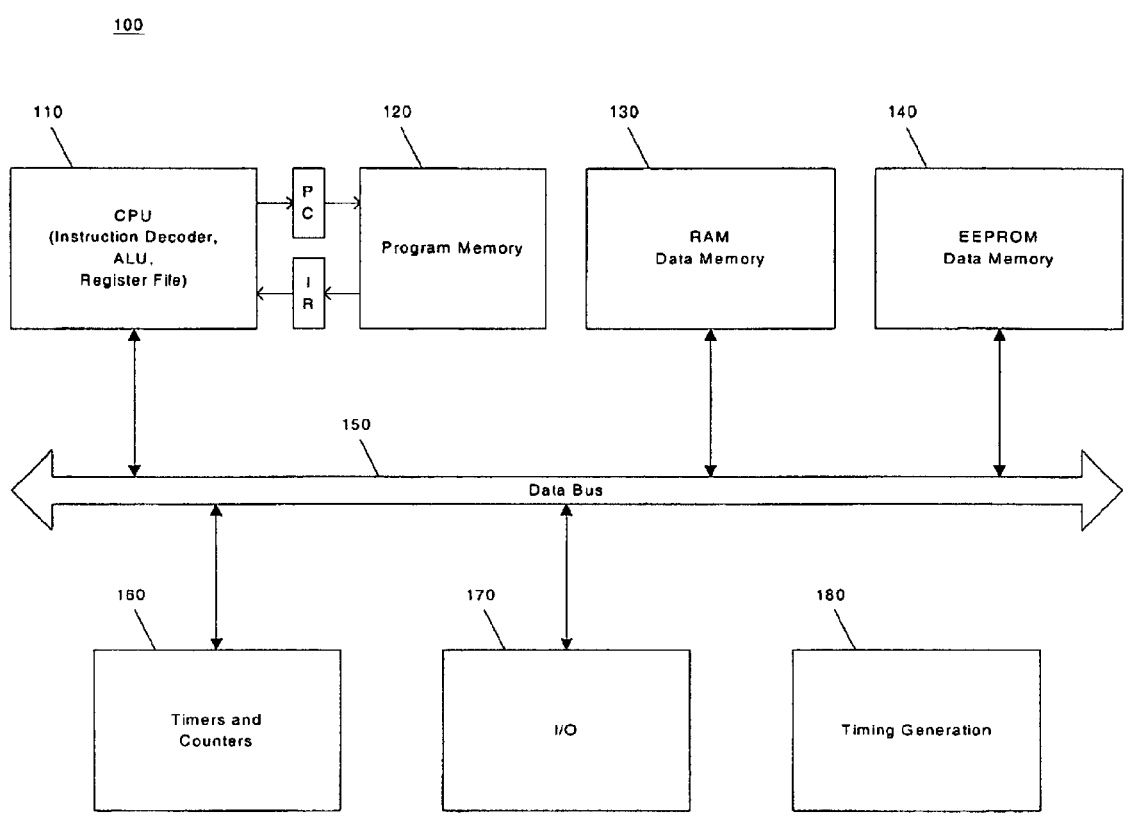
FIG. 1 illustrates a block diagram of an embedded system incorporating a central processing unit (CPU), program memory, RAM data memory and EEPROM data memory.

Referring to FIG. 1, an embedded processor 100 is shown that incorporates a central processing unit (CPU) 110, program memory 120, RAM based data memory 130 and EEPROM based data memory 140. A global data bus 150 connects the CPU 110 with the data memories 130 and 140. Program counter (PC) and instruction register (IR) registers are used to connect CPU 110 to program memory 120. Optionally present are special purpose peripherals such as timers and counters 160, I/O interface circuitry 170 and timing generation circuitry 180. An example of such an embedded processor is the PIC12F629 manufactured by Microchip Technologies. Although in the case of the PIC12F629, the embedded processor is incorporated into a single chip, in alternative embodiments, the system can consist of multiple chips. In particular, CPU 110 may be implemented in separate chips from program memory 120, RAM 130 and EEPROM 140.

In embedded processor 100, program memory 120 contains instructions that are executed by CPU 110 to perform the task necessary for the embedded application. The type of embedded application being performed is not relevant to the present invention except as it pertains to the requirement for dynamically writable non-volatile memory. Thus, the present invention could be used in a wide variety of applications, with widely ranging purposes as long as the application makes use of information stored in non-volatile memory and periodically changes the information stored in that memory during normal operation.

Non-volatile memories that can be dynamically written are used for many purposes in an embedded application. These memories are used to record configuration information that changes infrequently, to record logging information where the frequency of update is relatively low. Another use would be to record the operating state of a computer system (e.g. operating, standby, powered-off, etc.) so that if system power is interrupted and then reapplied, it is known what operating state the computer was previously in so it can be restored.

Consider a typical EEPROM memory array such as those described above in which a limit of 100,000 erase/program cycles is specified. If a product is intended for a 20 year lifespan, then it could perform one update approximately every 1.75 hours on average. In some cases this rate is unsatisfactory and it would be desirable to increase the allowable rate. Fortunately many embedded systems provide for more bits of storage than are needed. The present invention allows non-volatile memory endurance to be increased by trading off the number of erase/program cycles with the number of bits needed for data storage. That is, a single data bit is stored across multiple non-volatile memory bits such that changes to the data bit are distributed across the multiple non-volatile memory bits. In this way, the data bit can be changed more times than the non-volatile memory bits are changed, allowing the total number of changes to the data bit to be increased beyond the manufacturer specified limit for the number of changes to the non-volatile memory bits. In the optimal case, a change to a single bit, when distributed across bits will be encoded in such a way that the number of erase/program cycles is increased multiplicatively by n. Thus, a single bit stored in 32-bits would, in the optimal case, increase the allowed endurance from 100,000 cycles to 3,200,000 cycles. Over a 20 year lifespan, this translates to one change approximately every 3.3 minutes, instead of 1.75 hours. The present invention can be used to store multiple bits, and to store those multiple bits across any number of non-volatile memory bits. Thus, the present invention provides a solution to the storage of information in non-volatile memory whereby the number of bits stored is expanded and the endurance of that non-volatile memory is increased.

A preferred embodiment of the present invention makes use of gray codes. A gray code is an encoding of information in which for a defined sequence, only a single bit changes state with each step through the sequence. (A traditional binary counter does not have this property since for example, the four-bit encoding for the number three is 0011 and the four-bit encoding for the number four is 0100; in transitioning from 0011 to 0100 two bits, namely the two least significant bits, have changed state from 1 to 0.) An example of a four-bit gray code is shown in the Table 1 below.

TABLE 1

| State | Pattern |
|---|---|
| 0 | 0000 |
| 1 | 0001 |
| 2 | 0011 |
| 3 | 0111 |
| 4 | 1111 |
| 5 | 1110 |
| 6 | 1100 |
| 7 | 1000 |

Note that in Table 1, a single bit changes state in all cases of stepping from one state to the next in the defined sequence. For a given number of bits, there are multiple encoding schemes that constitute gray codes. A gray code in which the cycling of each bit is distributed evenly across bits is preferred for the present invention. However, any encoding of information in which bit cycling is distributed across multiple bits, even if not evenly and even if not a gray code, can be used with the present invention.

The use of a gray code sequence stored in non-volatile memory to encode a single data bit in effect allows the previous contents of the non-volatile memory to be used to control the next state. In the embodiments illustrated in FIGS. 3 through 6 and discussed in detail below, each single bit change causes a single gray code to step to the next sequence. Thus, each single data bit change is translated into a single non-volatile memory bit change, and distributed across multiple non-volatile memory bits. This means that a single bit cycle from 0 to 1 and back to 0 translates to a single erase/program cycle. Thus, the optimal endurance increase is achieved.

In some cases it is not sufficient to minimize the degree of single bit erase/program cycles because an automatic pre-erase takes place even for bits that are not changing state. For example, in order to write a single byte, the chip may erase all bits within that byte to a known state before programming the cells within that byte to the programmed state. The use of pre-erase may be built-in and not under the control of the firmware engineer. The size of the pre-erase block can vary. In the case that the erased state is 0 and the programmed state is 1, then a byte-level pre-erase would mean that a bit staying at 1 within a byte would actually be experiencing a cycling of its floating gate. This would mean that changing a byte from the state of 00001111 to the state 00001110 would actually involve four bits undergoing an erase and three bits undergoing an erase/program cycle. Alternatively, if the erased state is 1, then a bit staying at 0 experiences an erase/program cycle and a bit staying at 1 does not. The use of pre-erase is discussed in the Microchip application note entitled EEPROM Endurance Tutorial referenced above.

In order to minimize the number of erase/program cycles in cases where pre-erase takes place, it is desirable to use a one-hot encoding scheme where only a single bit at a time is in the programmed state. Depending on whether the erased state is 0 or 1, a preferred one-hot encoding scheme will result in one of the pattern sequences shown below:

TABLE 2

| State | Pattern 1 | Pattern 2 |
|---|---|---|
| 0 | 00000001 | 11111110 |
| 1 | 00000010 | 11111101 |
| 2 | 00000100 | 11111011 |
| 3 | 00001000 | 11110111 |
| 4 | 00001000 | 11101111 |
| 5 | 00100000 | 11011111 |
| 6 | 01000000 | 10111111 |
| 7 | 10000000 | 01111111 |

One disadvantage of pre-erase and the use of a one-hot encoding scheme such as one shown above is that for each step through the sequence, two bits are changing, one is being erased and another is being programmed. This means a single data bit change, if translated into a single step through the sequence, will result in one complete erase/program cycle rather than one half of an erase/program cycle as is the case for a gray code. Thus, the endurance advantage is only one half what it would be with a gray code in a system without pre-erase. The optimal endurance advantage can be achieved, however, if between each step of the simple one-hot sequence shown in Table 2 there were a state of 00000000 or 11111111 for pattern 1 or pattern 2 respectively. This extended one-hot sequence would involve only one half of an erase/program cycle with each step through the sequence. However, since the state is no longer identifiable from the pattern stored in memory, this solution would require additional information (stored in volatile memory) to fully identify the state.

A one-hot encoding scheme can be used in conjunction with a gray code to distribute a single bit across multiple bytes. For example, if a four bit gray code as shown in Table 1 is used, and if each bit is stored in a single byte according to the encoding of Table 2, the resulting bit can change state causing only a single bit to cycle across all 32 bits with each change in state. This means that the overall endurance is increased by 16 times (or 32 times in the case that an extended one-hot sequence is used) compared to one in which the single bit was stored in a specific bit in a single byte.

Figure 2:
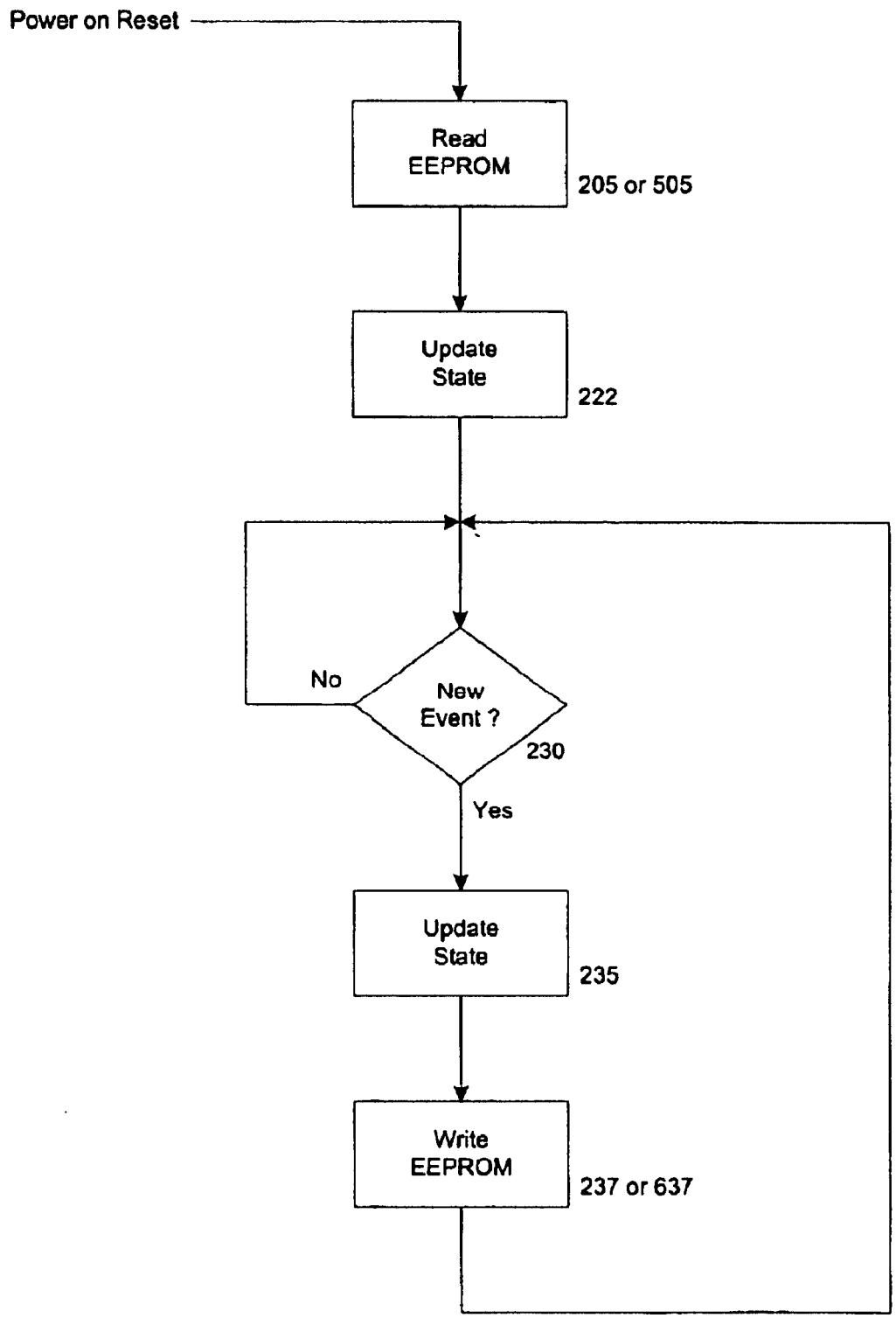
FIG. 2 illustrates a flow chart of an application of the present invention.
Figure 3:
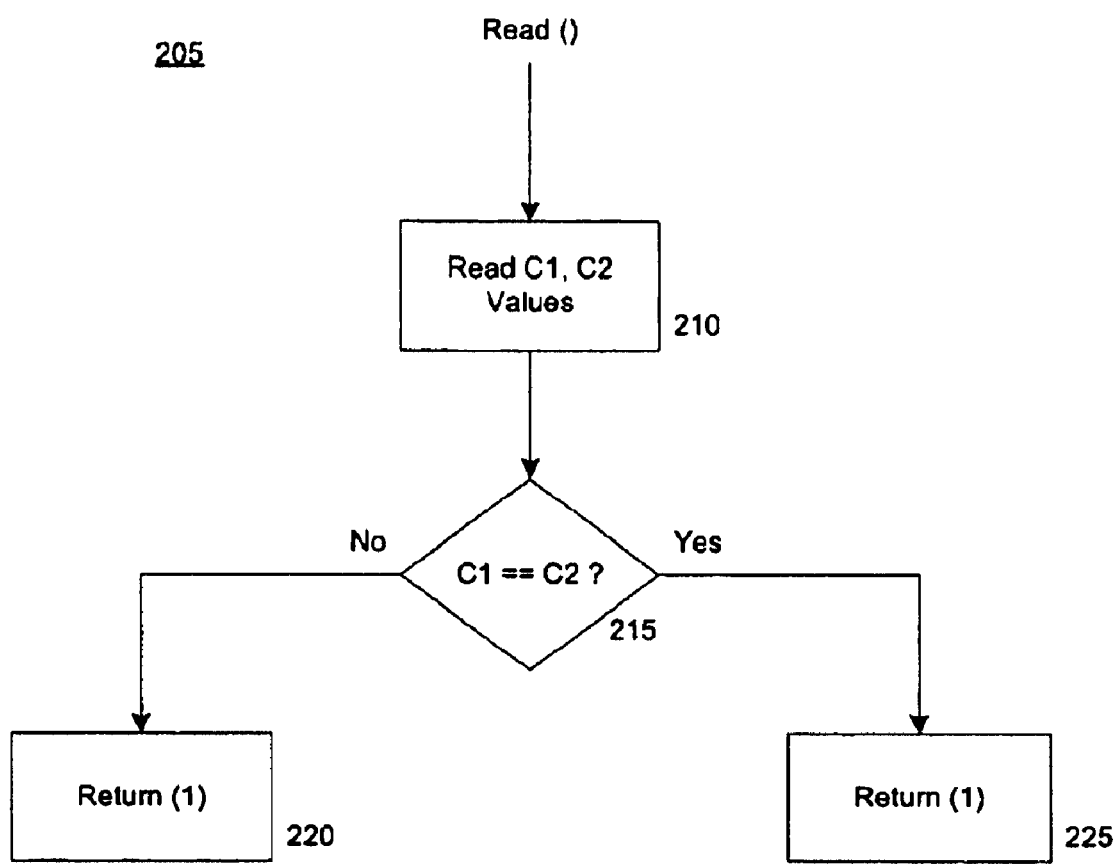
FIG. 3 illustrates a flow chart of a read operation of a first embodiment of the present invention.
Figure 4:
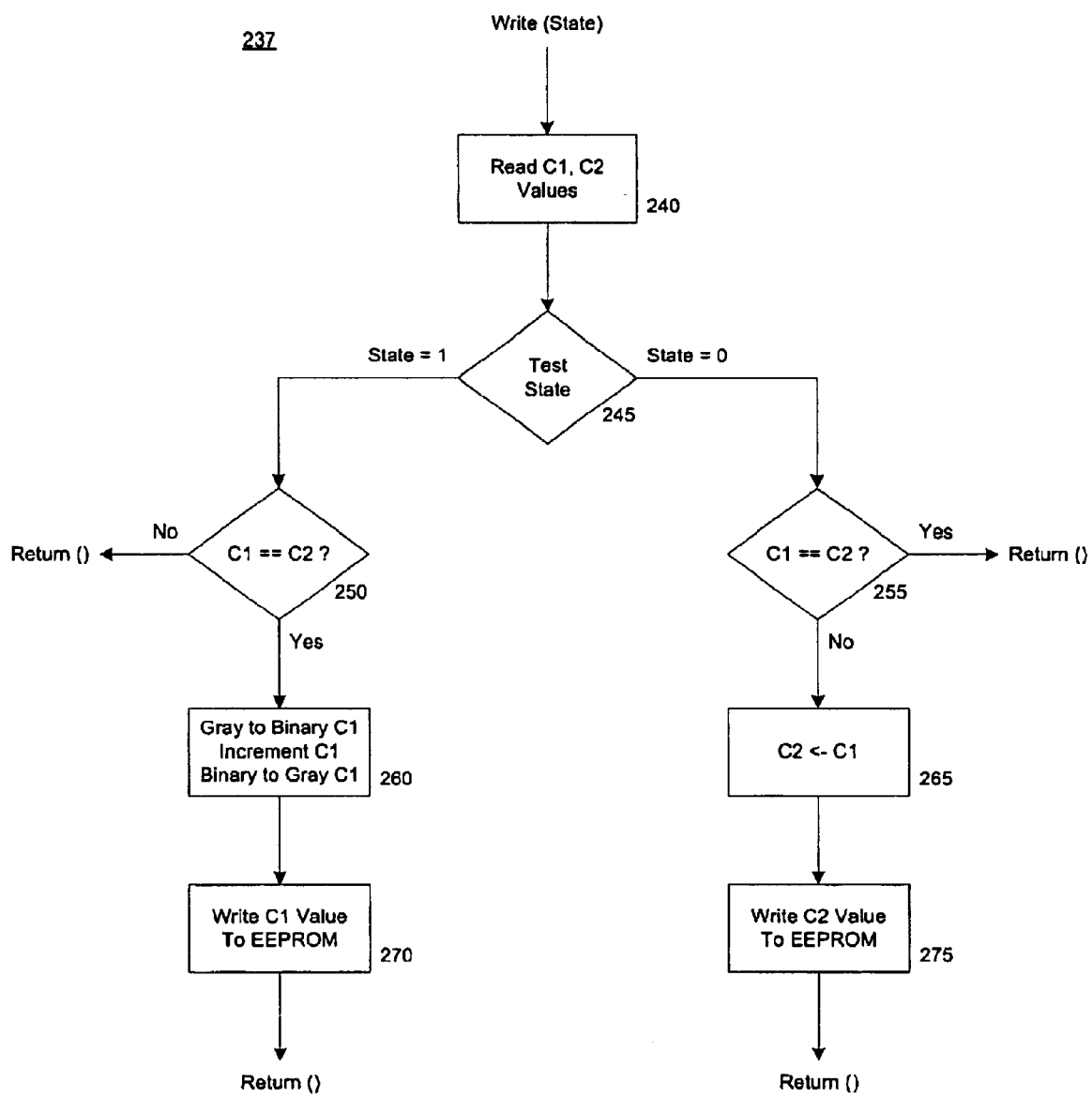
FIG. 4 illustrates a flow chart of a write operation of a first embodiment of the present invention.

Referring to FIGS. 2 through 4, one embodiment of the present invention utilizes two gray codes to store a single bit of information. As illustrated, when power is applied to the device, step 210 is executed which reads the contents of the two counters. The two counters are then compared for equality in step 215. If the counters are not equal, steps 220 and 222 are executed, which sets the state of the data bit to 1, and if the counters are equal, steps 225 and 222 are executed, which sets the state of the data bit to 0. Thereafter, an event loop is entered at step 230, which repeatedly checks for an event that changes the state of the data bit. When an event occurs, the data bit is updated in step 235.

FIG. 4 is the sequence in which the updated state bit is stored to the non-volatile memory. In step 240, the two gray code counters are read. In step 245, the updated data bit is tested. If the updated data bit is equal to 1, step 250 is executed and if the updated data bit is 0 step 255 is executed. The EEPROM is only written in the case that the updated data bit is different than the one encoded in non-volatile memory. This minimizes the number of erase/program cycles by only causing the EEPROM to be modified if necessary. In step 250, if the two gray code counters are not equal, then there is nothing to do and execution returns to event loop 230. Similarly, in step 255, if the two gray code counters are equal, execution returns to event loop 230.

In the case that the EEPROM needs to be updated, the update depends on whether the encoded data bit is changing from 0 to 1 or from 1 to 0. In step 265, the updated data bit is 0 and the encoded data bit is 1. Thus, the two gray code counters merely need to be set to be equal. In step 265 counter 2 is set equal to counter 1 and in step 275 the new value of counter 2 is written to the EEPROM. In step 260, the updated data bit is 1 and the encoded data bit is 0. This requires the first gray code counter to be advanced. First counter 1 is converted from a gray code to the binary encoding of the step number in the gray code sequence. Then the binary number is incremented by 1. Finally the new binary value is converted back to a gray code. In step 270, the updated value for counter 1 is written to the EEPROM.

Figure 5:
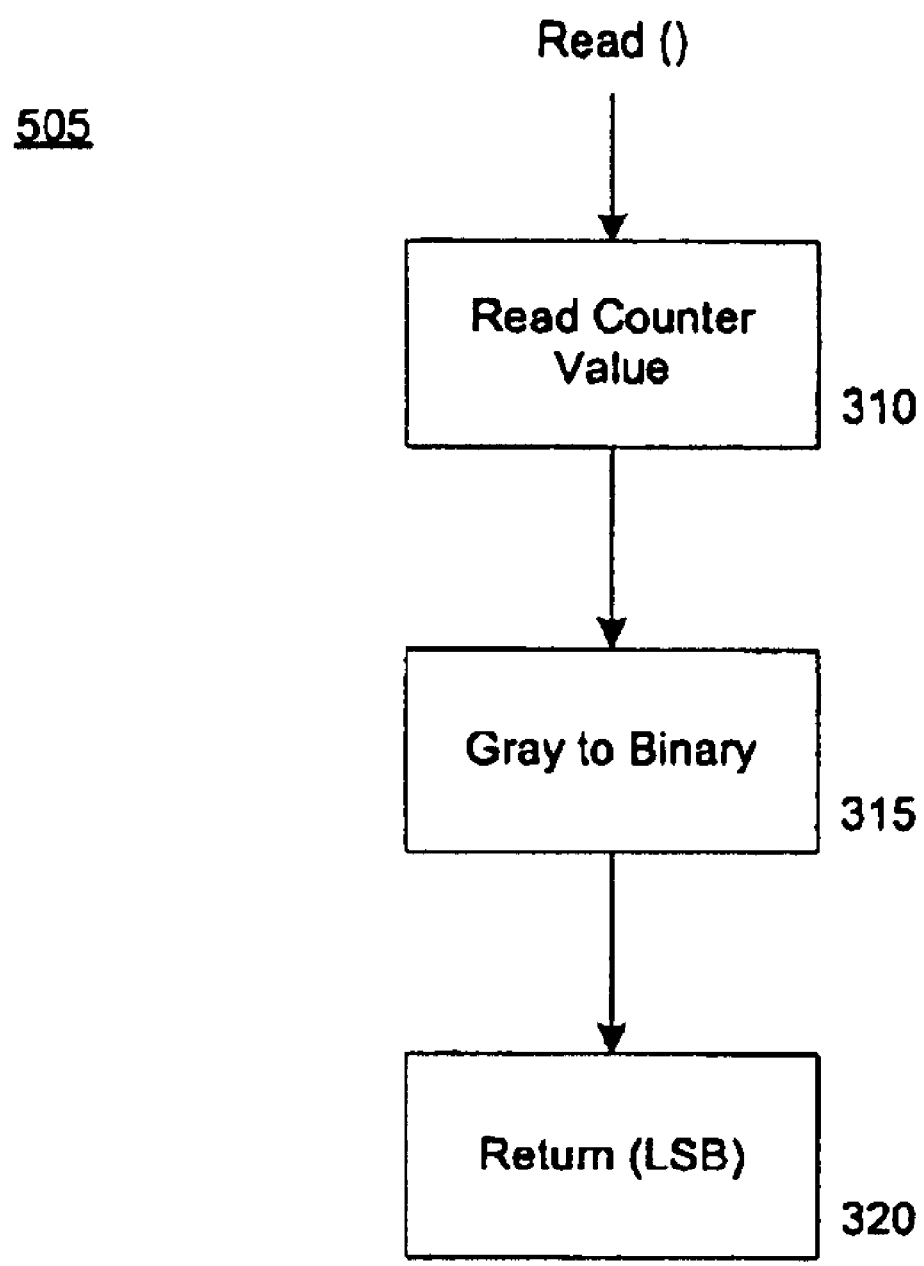
FIG. 5 illustrates a flow chart of a read operation of a second embodiment of the present invention.
Figure 6:
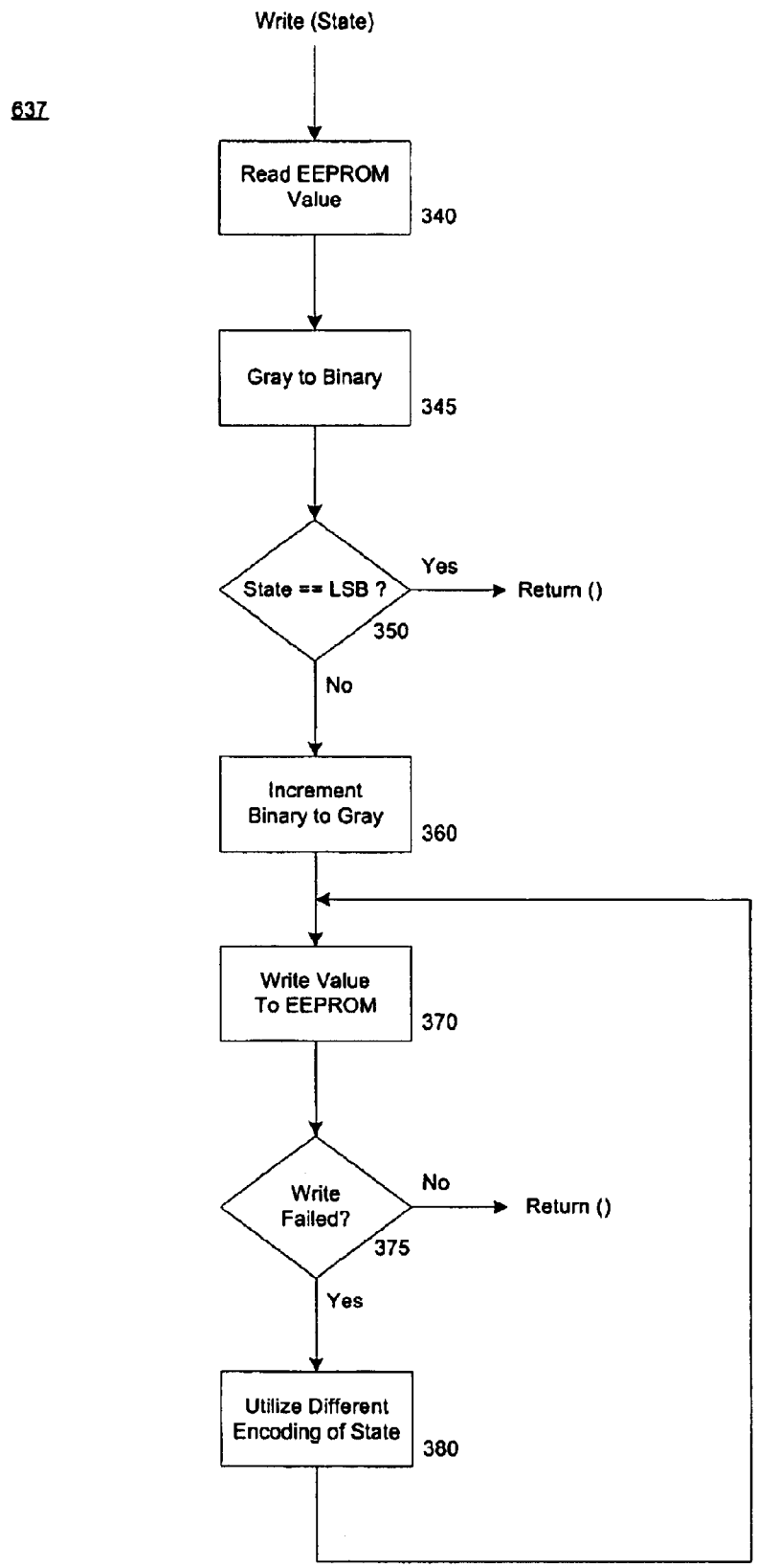
FIG. 6 illustrates a flow chart of a write operation of a second embodiment of the present invention.

Another embodiment of the invention is illustrated in FIGS. 2, 5 and 6. In this embodiment, only a single gray code counter is used to store a single data bit and the least significant bit of the binary value represents the encoded data bit value. In step 310, the counter is read from memory and in step 315 the gray code value is converted into a binary encoding of the step number in the gray code sequence. In steps 320 and 222 the data bit is set to the least significant bit (LSB) of this binary value.

In step 340 the counter is read from the EEPROM and in step 345 it is converted to a binary value as was done in step 315. In step 350 the LSB of the binary value is compared to the updated data bit value. Only if they are different does an update of the EEPROM take place. If the LSB and the data bit value agree, execution returns to event loop 330. In the case that the LSB of the binary value and the data bit value disagree, the binary value is incremented and the incremented binary value is converted to a gray code in step 360. In step 370 the new gray code value is written to the EEPROM.

Another aspect of the present invention relates to continued storage and retrieval of information in the presence of memory cell failures. An advantage of allowing operation to continue with failed memory cells is the overall robustness of the system is increased. Also it is significant that sometimes the minimum and typical erase/program cycles specified by the manufacturer are different. As noted above, Microchip specifies the PIC12F629 at 100,000 cycles minimum, but 1,000,000 cycles typical. As long as memory cells fail one by one, and not all at once, being able to accommodate a small number of failed bits may greatly increase the overall endurance of the system. When a floating gate fails, it typically experiences what is known as a "stuck-at" failure. This means that a single bit either remains at 0 and cannot be set to 1 or remains at 1 and cannot be set to 0.

Because the present invention distributes the storage of a single bit across multiple bits, stuck-at failures are accommodated by eliminating the stuck bit from the set of bits that are participating in the storage and retrieval. Ideally this will result in a slightly increased number of cycles on the remaining bits. For example, in the case that a single bit is being stored in 32-bit as described above, a single stuck-at failure will result in the remaining 31 bits being cycled equally. This will result in an endurance enhancement of 31 times instead of 32 times. In the present invention, stuck-at failures are accommodated by repeating the write step after detecting the failed bit and utilizing a different encoding of the same data value. It will be appreciated that multiple mechanisms are possible, including those that record the failed bits using other bits in the non-volatile memory and applying the present invention to the non-failed bits.

Although the preceding discussion has centered on the storage of a single bit utilizing multiple bits of non-volatile memory, it will be appreciated that the present invention can be applied to storing multiple bits of information. In a straightforward application of storing multiple bits, the present invention is repeated for each bit being stored. For example, if a single bit is being stored across 32-bits as illustrated above, a total of 32-bits can be stored in the 128-bytes available on the PIC12F629. Each four bytes could be used to store one bit and the process would be repeated up to 32 bits of storage. An alternative to repeating the storage in this way is to store more than one bit in each gray encoded counter.

Although certain aspects of the preceding discussion focuses on non-volatile memory based on floating gate memory cells, there are other types of memory cells that have endurance limitations, and the present invention could be used in conjunction with any memory technology where an erase and/or write cycle endurance limitation exists.

What is claimed is:

1. A method of increasing the endurance of no-volatile memory comprising the steps of:
   a) converting a first stored pattern of a plurality of bits into a smaller number of bits representing a first data value; reading the first data value; and
   b) converting one or more bits representing a second data value in a second pattern of a larger number of bits to be stored, writing the second stored pattern and an existing pattern of bits stored in said non-volatile memory such that a subset of said existing pattern of stored bits changes from their existing states.

2. The method of claim 1 wherein said first and second stored bit patterns are striped across multiple words such that each word stores one bit of information.

3. The method of claim 1 wherein the failure to successfully complete said writing step due to a failure of one or more bits causes the writing step to be repeated with a third stored pattern of bits such that said third pattern of bits is equivalent to said second data value.

4. The method of claim 1 wherein:
   a. the step of reading includes reading two values from memory and returning a bit indicating whether the two values are equal or not equal; and
   b. the step of writing includes writing a bit to memory by: leaving the memory unchanged, changing the contents of a first value stored in memory such that it is not equal to a second stored value, or by setting said second value equal to said stored first value.

5. The method of claim 4 wherein said stored bit patterns are striped across multiple words such that one bit is stored in each word.

6. The method of claim 4 wherein the failure to successfully complete said write due to a failure of one or more bits causes the step of writing to be repeated such that data stored in memory is equivalent to said bit being written.

7. The method of claim 1 wherein:
   a. the step of reading includes converting a bit pattern stored in memory into a first data bit using a gray code to binary conversion; and
   b. the step of writing includes reading a second bit pattern from memory and either leaving the memory unchanged or converting it into a third bit pattern using a gray code to binary conversion, followed by a two's complement add, followed by a binary to gray code conversion.

8. The method of claim 7 wherein said first, second and third stored bit patterns are striped across multiple words such that one bit is stored in each word.

9. The method of claim 7 wherein the failure to successfully complete said write due to a failure of one or more bits causes the step of writing to be repeated with a fourth pattern of bits such that said fourth pattern of bits is equivalent to said second data bit.

10. An embedded system comprising:
a central processing unit;
non-volatile memory; and
program code configured to convert a first stored pattern of a plurality of bits into a smaller number of bits representing a first data value and read the first data value from said non-volatile memory; convert one or more bits representing a second data value into a second stored pattern of a larger number of bits to be stored, and write the second stored pattern to said non-volatile memory and then utilizing an existing pattern of bits stored in said non-volatile memory such that a subset of said existing pattern of the stored bits changes from their existing states.

11. The embedded system of claim 10 wherein said first and second stored patterns of bits are striped across multiple words such that each word stores one bit of information.

12. The embedded system of claim 10 wherein the failure to successfully complete said write due to a failure of one or more bits causes the program code to repeat said write with a third stored pattern of bits such that said third pattern of bits is equivalent to said second data value.

13. The embedded system of claim 10 wherein said program code is configured to read two values from said non-volatile memory and return a bit indicating whether the two values are equal or not equal, and to write a bit to said non-volatile memory by: leaving the memory unchanged, changing the contents of a first value stored in memory such that it is not equal to a second stored value, or by setting said second value equal to said stored first value.

14. The embedded system of claim 12 wherein said first and second stored patterns are striped across multiple words such that one bit is stored in each word.

15. The embedded system of claim 14 wherein the failure to successfully complete said write due to a failure of one or more bits causes the program code to repeat said write such that data stored in memory is equivalent to said bit being written.

16. The embedded system of claim 10 wherein said program code is configured to read a first bit pattern from said non-volatile memory and convert into a first data bit using a gray code to binary conversion, and to write a second data bit to said non-volable memory by reading a second bit pattern from memory and either leaving the memory unchanged or converting it into a third bit pattern using a gray code to binary conversion, followed by a two's complement add, followed by a binary to gray code conversion.

17. The embedded system of claim 16 wherein said first and second stored patterns are striped across multiple words such that one bit is stored in each word.

18. The embedded system of claim 17 wherein the failure to successfully complete said write due to a failure of one or more bits causes the program code to repeat said write with a fourth pattern of bits such that said fourth pattern of bits is equivalent to said second data bit.

19. A method of increasing the endurance of non-volatile memory comprising reading and writing information to said non-volatile memory, wherein said reading of information comprises the steps of:
a reading a first stored data value comprising a plurality of bits from said non-volatile memory;
b. converting said first stored data value into an input data value comprising at least one bit, wherein said input data value contains fewer bits than said first stored data value;

and wherein said writing of information comprises the steps of:
c. reading a second stored data value comprising a plurality of bits from said non-volatile memory;
d. converting an output data value comprising at least one bit into a third stored data value comprising a plurality of bits, wherein said output data value contains fewer bits than said third stored data value;
e. writing said third stored data value into said non-volatile memory; wherein said step of converting utilizes said second stored data value such that not all bits of said third stored data value are different from said second stored data value.

20. The method of claim 19 wherein said input data value and said output data value consist of one bit of information.

21. The method of claim 19 wherein said first, second and third stored data values are striped across multiple words in said non-volatile memory such that each said word stores one bit of said first, second and third stored data values.

22. The method of claim 19 wherein the failure to successfully complete said step of writing due to a failure of at least one bit in said third stored data value causes said step of writing to be repeated utilizing a fourth stored data value that is a different encoding of said output data value.

23. A method of increasing the endurance of non-volatile memory comprising reading and writing information to said non-volatile memory, wherein said reading of information comprises the steps of:
a. reading a first stored data value comprising a first two words from said non-volatile memory;
b. testing said two words for equality and returning a one bit input data value indicating an equivalence status of said two words, said equivalence status comprises one of a first status indication said two words are equal and a second status indication said two words are not equal;

and wherein said writing of information comprises the steps of:
c. receiving a one bit output data value;
d. reading a second stored data value comprising a second two words from said non-volatile memory;
e. testing said second two words for equality and performing one of the following sub-steps depending on the equality of said second two words and said one bit output data value:
   i. leaving the contents of said second two words unchanged;
   ii. writing a first of said second two words with a value different than a second of said second two words;
   iii. writing said second of said second two words with a value equal to said first of said second two words.

24. A method of increasing the endurance of non-volatile memory comprising reading and writing information to said non-volatile memory, wherein said reading of information comprises the steps of:
a. reading a first stored data value from said non-volatile memory;
b. converting said first stored data value into an input data value using a first logical operation;

and wherein said writing of information comprises the steps of:
c. receiving an output data value;
d. reading a second stored data value comprising a plurality of bits from said non-volatile memory;
e. converting said second stored data value into a previous data value using said first logical operation;

f. if said output data value is equal to said previous data value, leaving said non-volatile memory unchanged; and if said output data value is not equal to said previous data value, converting said output data value into a third stored data value using a second logical operation and writing said third stored data value to said non-volatile memory.

25. The method of claim 24 wherein said first logical operation is a gray code to binary conversion and wherein said second logical operation is a gray code to binary conversion, followed by a two's complement add, followed by a binary to gray code conversion.

26. The method of claim 24 wherein said first stored data value, said second stored data value, and said third stored data value are striped across multiple words such that one bit is stored in each said word of said non-volatile memory.

27. The method of claim 24 wherein the failure to successfully complete said writing said third stored data value due to a failure of at least one bit in said third stored data value causes said writing to be repeated utilizing a fourth stored data value that is a different encoding of said output data value.

\* \* \* \* \*

UNITED STATES PATENT AND TRADEMARK OFFICE
CERTIFICATE OF CORRECTION

PATENT NO. : 6,794,997 B2
DATED : September 21, 2004
INVENTOR(S) : Steven T. Sprouse It is certified that error appears in the above-identified patent and that said Letters Patent is hereby corrected as shown below:

Column 9,
Line 46, please delete "convert into" and substitute -- convert it into --.
Line 48, please delete "non-volable" and substitute -- non-volatile --.

Signed and Sealed this

Twenty-second Day of February, 2005

JON W. DUDAS
*Director of the United States Patent and Trademark Office*